(12) United States Patent
Kienlen (10) Patent No.: US 7,750,321 B2
(45) Date of Patent: Jul. 6, 2010

(54) POSITIONING DEVICE FOR POSITIONING AN APERTURE PLATE IN AN ION BEAM

(75) Inventor: Gabriel Kienlen, Houssen (FR)

(73) Assignee: Micronas GmbH, Freiburg (DE)

( * ) Notice: Subject to any disclaimer, the term of this patent is extended or adjusted under 35 U.S.C. 154(b) by 301 days.

(21) Appl. No.: 11/854,910

(22) Filed: Sep. 13, 2007

(65) Prior Publication Data

US 2009/0039289 A1 Feb. 12, 2009

(30) Foreign Application Priority Data

Aug. 7, 2007 (EP) .................................. 07015469

(51) Int. Cl.
*H01J 37/317* (2006.01)
*H01J 37/36* (2006.01)
(52) U.S. Cl. .............................. 250/492.21; 250/491.1; 250/440.11; 250/441.11; 250/442.11
(58) Field of Classification Search .............. 250/491.1, 250/492.21, 442.11
See application file for complete search history.

(56) References Cited

U.S. PATENT DOCUMENTS

| | | | |
|---|---|---|---|
| 4,514,858 A * | 4/1985 | Novak | 378/34 |
| 4,516,253 A * | 5/1985 | Novak | 378/34 |
| 5,671,057 A | 9/1997 | Kawai | |
| 5,811,823 A * | 9/1998 | Blake et al. | 250/492.21 |
| 6,252,412 B1 * | 6/2001 | Talbot et al. | 324/750 |
| 6,717,653 B2 * | 4/2004 | Iwamoto et al. | 355/72 |
| 6,903,346 B2 * | 6/2005 | Sogard et al. | 250/442.11 |
| 6,906,782 B2 * | 6/2005 | Nishi | 355/53 |
| 6,992,311 B1 * | 1/2006 | Ring et al. | 250/492.21 |
| 7,078,712 B2 * | 7/2006 | Perel et al. | 250/492.21 |
| 7,470,918 B2 * | 12/2008 | Tokuda et al. | 250/492.1 |
| 2003/0217474 A1 | 11/2003 | Kao et al. | |
| 2005/0056794 A1 | 3/2005 | Simmons | |

FOREIGN PATENT DOCUMENTS

| | | |
|---|---|---|
| EP | 0690475 A | 1/1996 |
| WO | 9009559 A | 8/1990 |

* cited by examiner

*Primary Examiner*—David A Vanore
(74) *Attorney, Agent, or Firm*—The Webb Law Firm (57) ABSTRACT

A positioning device for positioning an aperture plate in an ion beam of an ion implantation system has two fixture parts that can be moved relative to each other by means of at least one positioning drive, of which the one fixture part can be connected or is connected to an abutment point that is disposed in a fixed location relative to an ion beam source, and the other fixture part can be connected or is connected to the aperture plate. An adjustment device has a fixture device and a display device. By means of the position-changing device, it is possible to change the position of at least one of the fixture parts relative to the positioning drive. By means of the display device it is possible to check whether the fixture parts are in a predetermined position relative to each other. On the first fixture part or in a part that is connected thereto in a fixed position, the display device has at least one reference mark and on the second fixture part at least one optical projection device by which means at least one optical marking that is assigned to a reference mark, of which at least one must be present, can be projected onto the first fixture part.

12 Claims, 9 Drawing Sheets

POSITIONING DEVICE FOR POSITIONING AN APERTURE PLATE IN AN ION BEAM

The invention relates to a positioning device for positioning an aperture plate in an ion beam of an ion implantation system, where the positioning device has two fixture parts that can be moved relative to each other by means of at least one positioning drive, and one of the fixture parts is connected to an abutment point that is located in a fixed position relative to an ion beam source and the other fixture part can be or is connected to the aperture plate, and an adjustment device is provided with a position-changing device and a display device, and by means of the position-changing device the position of at least one of the fixture parts may be changed relative to the positioning drive, and it is possible to verify by means of the display device whether the fixture parts are in a predetermined position relative to each other, and the display device has at least one reference mark on the first fixture part or on a part that is connected to it in a fixed position.

A positioning device of this type, which is also known as a manipulator, is known in actual practice and is marketed by Varian Semiconductor Equipment Associates, Inc., Gloucester, Mass., USA. The positioning device is used in the fabrication of semiconductor chips to align an ion beam generated by an ion source along a predetermined path curve and to project it onto a wafer. For this purpose, the positioning device has a graphite aperture plate that is disposed in the path and whose aperture is smaller than the diameter of the ion beam. The aperture plate is connected to an electrode plate in such a way that it may be removed. An electrical voltage, whose purpose is to direct the largest possible number of ions through the aperture in the aperture plate, is applied to the electrode plate.

In order to position the aperture plate in the ion beam, the positioning device has two movable fixture parts, of which a first fixture part is connected to the abutment point, which is disposed in a fixed position relative to the ion beam source, and a second fixture part is connected by means of the ground plate to the electrode plate in an electrically insulating manner. The second fixture part can be positioned relative to the ion beam in the X, Y, and Z directions together with the ground plate that is disposed relative to it, the electrode plate, and the aperture plate.

A position sensor that provides a position measurement signal for the axis that is assigned to the positioning drive is assigned to each positioning drive. The positioning drives are controlled by means of position controllers that each have an input for a setpoint signal and an output for the position sensor signal from the position sensor assigned to the corresponding positioning drive. If there is a difference between the setpoint signal and the position sensor signal, the positioning of the aperture plate is changed with the aid of the position controller in order to reduce the difference.

Before the positioning device is initially put into service, and after each maintenance activity in which the positioning device is disassembled, for example in order to clean the aperture plate, the ground plate, and the electrode plate, the positioning device that has been removed from the ion implantation system is adjusted with the aid of a display device. During the adjustment, the positioning drives must be in a predetermined reference position. Therefore, before the start of maintenance work on the positioning device that is connected to the ion implantation system, the positioning drives must be traversed electrically to the reference position.

The display device has a first indicator part that has an approximately circular disc shape, and a second display part that has a roughly rectangular shape. The second display part has a circular aperture that matches the first part. Marking lines are arranged on both display parts. The first display part is installed on the second fixture part instead of the ground plate, and the second display part is screwed onto a fixed housing of the positioning device. The circular disk-shaped first part is disposed in the opening of the second part, or it is axially at a slight distance from the second part.

Then the drive connections between the positioning drives and the second fixture part are interrupted by the loosening of screws, and the second fixture part is aligned manually relative to the first fixture part in such a way that the marking lines of the first display part that are assigned to the X- and the Y-axis line up with the corresponding marking lines on the second display part and, in addition, the circular disc-shaped second display part is disposed in the plane defined by the aperture of the first display part. Then the screws are tightened again in order to restore the drive connections between the positioning drives and the second fixture part. Then the display device is removed, and the ground plate and the electrode plate are screwed onto the second fixture part so that the aperture plate can then be installed on the electrode plate.

However, the positioning device has a disadvantage, namely that positioning errors can easily occur when the fixture parts are adjusted manually. In addition, when the ground plate and the electrode plate are installed, there can be play on the one hand between the second fixture part and the ground plate and between the ground plate and the electrode plate on the other hand, so that the aperture plate then is no longer located in the correct position relative to the second fixture part. During the ion implantation such aperture plate positioning tolerances cause the ion beam to deviate from its intended path curve, so that the ion current that strikes the wafer is reduced. In order to reduce wafer fabrication tolerances, the ion current is measured and the irradiation time is adjusted depending on the ion current. Therefore, incorrect positioning of the aperture plate causes the irradiation time to be lengthened, which reduces productivity and leads to correspondingly higher production costs. Another disadvantage is that, if the ion current is too low, the time required to fine-tune the positioning device is increased, which causes additional production time to be lost.

The object of the invention therefore is to create a positioning device of the type referred to above that easily permits the aperture plate to be arranged in a predetermined position relative to the first fixture part.

This object is achieved when the display device on the second fixture part has at least one optical projection device by which means at least one optical marking that is assigned to a reference mark, of which at least one must be present, can be projected onto the first fixture part.

The optical projection device preferably is embodied in such a way and is disposed on the second fixture part in such a way that the marking projected with the aid of the projection device lines up with the reference mark in a predetermined reference position. The light pointer that produces the optical mark thereby permits the fixture parts to be positioned very accurately.

In a preferred embodiment of the invention the aperture plate can be connected in a removable manner to a holder provided on the second fixture part, and the projection device is embodied in such a way that it can be connected to the holder instead of the aperture plate. Possible positioning tolerances that can be caused by manufacturing and/or installation tolerances are then taken into account in the adjustment and can be compensated for by appropriately positioning the second fixture part relative to the first fixture part.

It is advantageous if the holder preferably has at least one guide rail for the swallowtail guide, and if the aperture plate and the projection device are located on a carriage part that fits the guide rail and can be mounted on the guide rail and removed from said guide rail, or if the holder is configured as such a carriage part. Then, in order to adjust the positioning device, the aperture plate can easily be removed from the guide rails and replaced by the projection device. After the adjustment is completed, the projection device is removed from the guide rail in a corresponding manner, and replaced by the aperture plate. Therefore, the projection device may be installed on the holder with high precision.

In a preferred embodiment of the invention, the projection device embodied so as to project at the least two lines that are perpendicular to each other, preferably solid and/or dashed lines that cross each other, where a first line extends roughly parallel to a first axis of the positioning device, and a second line extends roughly parallel to a second axis of the positioning device, and where preferably at least one first reference mark is assigned to the first line on the first fixture part and preferably at least one second reference mark is assigned to the second line. In this way the two axes can be adjusted with an optical marking that is produced by only a single projector.

In a preferred embodiment of the invention the positioning device has at least one third axis that is perpendicular and, in particular, orthogonal to the first axis and to the second axis, where the projection device is embodied in such as way as to project a third line that runs parallel to the third axis, and where preferably at least one third reference mark is assigned to the third line on the first fixture part. Thus, with the aid of the optical display device, all three axes of the positioning device can be checked to make certain that they are set correctly.

In a preferred embodiment of the invention, the holder is connected to the second fixture part in such the way that it can be removed and preferably is disposed on an electrode plate that is electrically isolated from the second fixture part and that has a hole through which the ion beam can pass. The part containing the holder can then be disassembled and easily cleaned during maintenance work. An electrical voltage that helps the ion beam pass through the aperture plate may be applied to the electrode plate during the implantation process.

It is particularly advantageous if the reference mark, of which at least one must be present, is assigned to the carrier part, which can be connected in a removal manner to the first fixture part, and if the carrier part is embodied in such a way that it can be connected to the first fixture part and can be removed from said first fixture part while the electoral plate is installed on the first fixture part. In this way, the settings of the individual axes of the positioning device can be checked without removing the electrode plate. In this way, the axes can be adjusted even more precisely.

It is advantageous for at least one portable control device to be provided to control a positioning drive, of which at least one must be present, and for the said portable control device to be able to be connected in a removable manner by means of an electrical plug-type connection to at least one positioning drive, where the control device has at least one operating element for the positioning drive. If a positioning device is removed from the ion implantation system, the axes may then be easily positioned electrically for mechanical zeroing using the portable control device.

It is advantageous if, in order to determine the position of the positioning drive, of which at least one must be present, the positioning device has at least one positioning drive, which has at least one position sensor, and if the control device has at least one position display connected to it. The zero position of the positioning device can then be adjusted to assume a predetermined reference position, both mechanically as well as electrically. The position sensor may have a potentiometer and/or an encoder.

The positioning device of the invention may be part of an ion implantation system, whereby the positioning device has at least one position sensor having an output for a first position measurement signal that is connected by means of the compensation device and the position controller to at least one positioning drive, where the compensation device has an input that is connected to the position sensor for the first position measurement signal, and an output for a second position measurement signal that is connected to an actual-value input on the position controller, and the compensation device is embodied in such a way that it provides the second position measurement signal as a function of the first position measurement signal and of at least one machine-specific parameter of the ion implantation system that affects the ion beam path curve. In a preferred manner the compensation device permits deviations of the ion beam path curve from a specified line to be compensated electrically by means of machine-specific tolerances. In a fabrication facility that has a number of implantation systems, the positioning device from one implantation system can be exchanged with the positioning device of another implantation system without changing the course of the path curve between the aperture plates and the wafer that is to be irradiated in the implantation systems.

It is advantageous if at least one of the position sensors is connected to the position controller by means of a plug-type connection, if the plug-type connection has a first plug-type connection part and a matching second plug-type connection part, and if the compensation device is embodied as an adapter that can be interposed between the plug-type connection parts and that has a third plug-type connection part that can be connected to the first plug-type connection part and that has a fourth plug-type connection part that can be connected to the second plug-type connection part. In this way it is possible in particular to retrofit an existing ion implantation system with the compensation device by inserting said compensation device in a simple manner between the plug-type connection parts of the implantation system.

In an advantageous manner the compensation device has at least one positioning element that can be used to set the transfer function between the first and the second position measurement signal. In this way, the compensation device can be adapted in a simple manner to the given individual properties of the ion implantation system.

An example of the invention is illustrated in greater detail below based on the drawing. The drawing shows:

FIG. 2 a partial view of the positioning device, on which the aperture plate can be seen, FIG. 3 a diagram similar to that in FIG. 2, however, where the aperture plate is replaced by an optical projection device and a carrier part having reference marks is installed on a first fixture part of the positioning device, FIGS. 4 and 5 side views of the carrier part, FIG. 6 a portable control device for the positioning drives of the positioning device, FIG. 7 a graphical representation of the position measurement signals for the X-axis of four ion implantation systems that have the same design and tolerances, where the normalized scale position signal is plotted on the abscissa and the positioning path is plotted on the ordinate, and where a target line is indicated by a dashed line.

Figure 1:
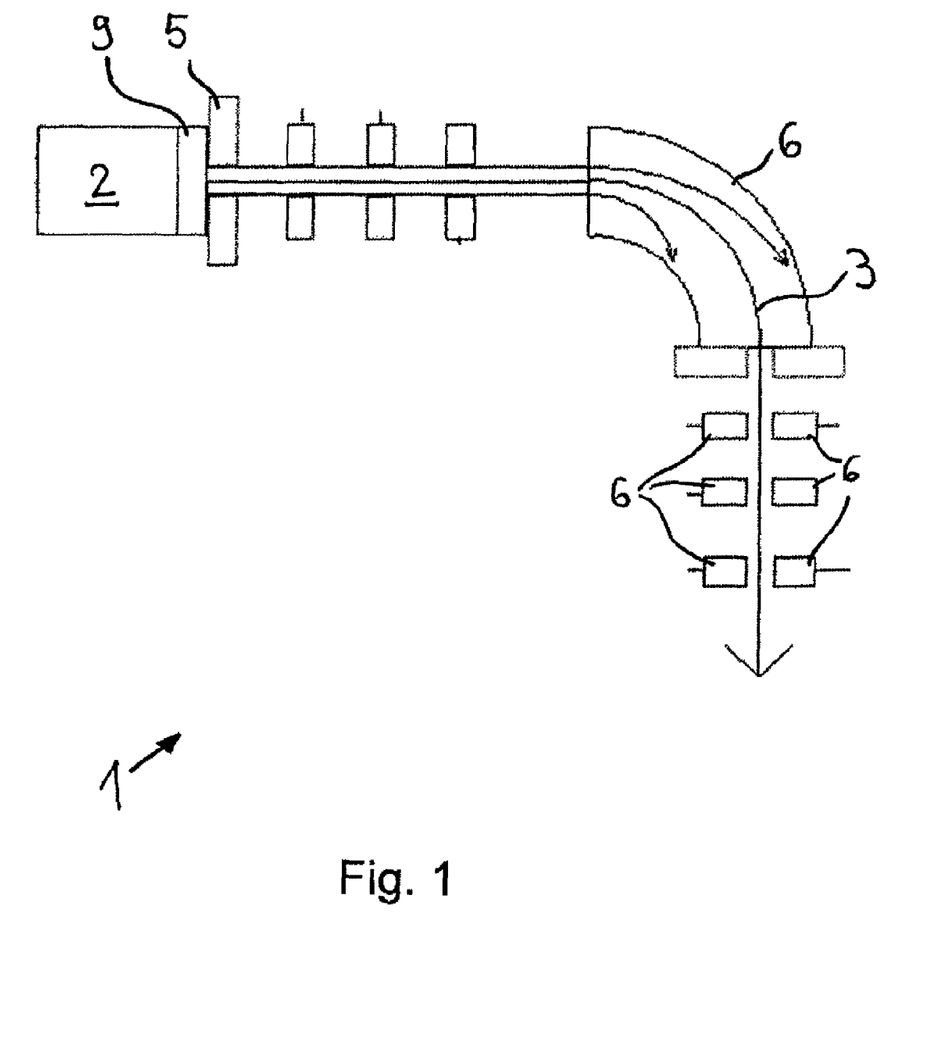
FIG. 1 a schematic diagram of an ion implantation system that has an ion beam source, a positioning device for positioning an aperture plate in the ion beam, and a beam guide for the ion beam.

An ion implantation system shown in its entirety as 1 in FIG. 1 has an ion beam source 2 for generating an ion beam 3, an aperture plate 4 located in the ion beam 3, a positioning device 5 for positioning the aperture plate 4 in the ion beam 3, and a beam guidance system 6 located between the aperture plate 4 and a semiconductor wafer that is to be irradiated. The aperture plate 4 has a roughly slot-shaped aperture and it consists of a material that is impenetrable for the ion beam, graphite for example.

Figure 2:
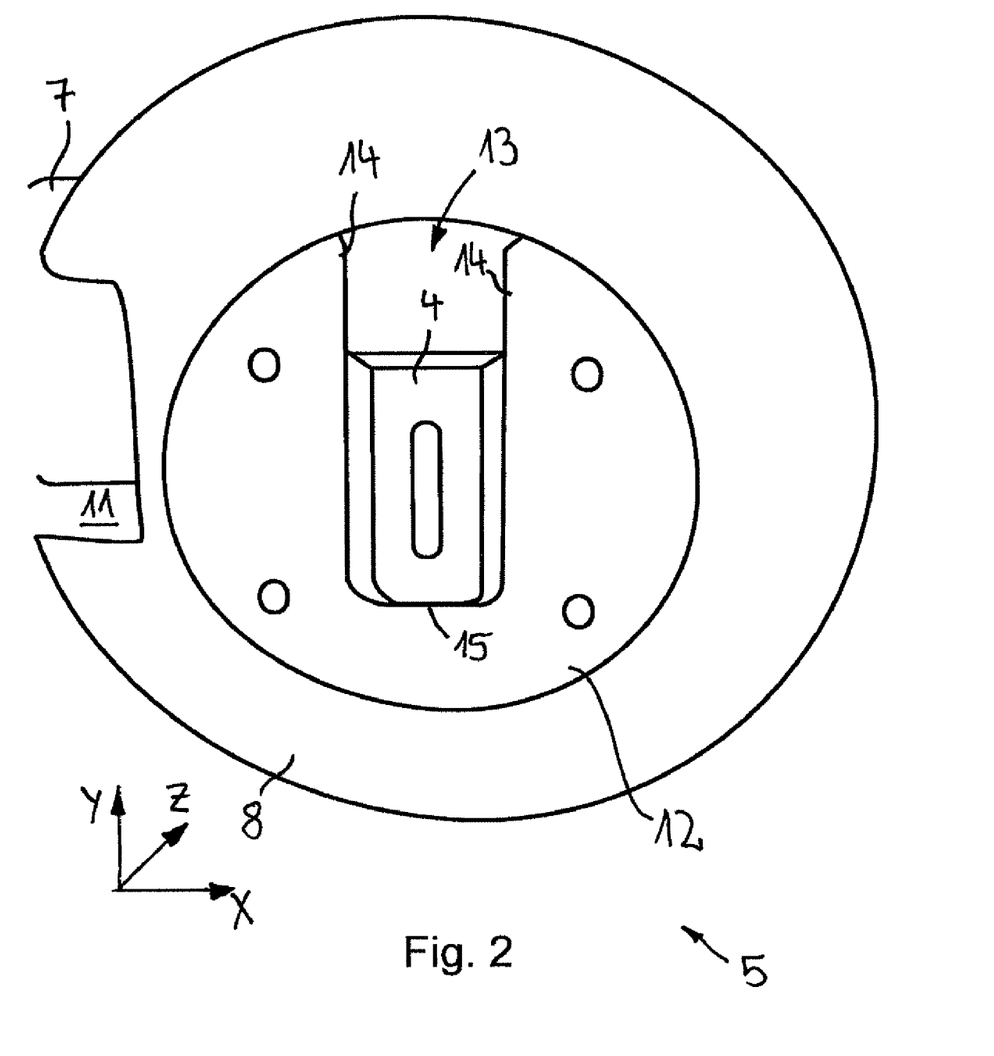

The positioning device 5 has two movable fixture parts 7, 8, that can be moved relative to one another and that are shown in greater detail in FIG. 2, of which a first fixture part 7 is connected in a removable manner with an abutment point 9 that is disposed in a fixed position relative to the ion beam source 2, and a second fixture part 8 is connected in a removable manner to a positioning element, which is not shown in the drawing. The positioning element can be positioned relative to the first fixture part 7 on three axes in the X-, Y-, and Z-directions by means of electrical positioning drives 10a, 10b, 10c.

The second fixture part 8 is essentially embodied in an annular disc shape with a roughly circular opening. At the outer side facing its positioning drives 10a, 10b, 10c, the second fixture part 8 has a recess 11 that is open at the margins.

An electrode plate 12, which is separated from the second fixture part 8 by means of electrical installation, is connected in a removable manner to the second fixture part 8. The electrode plate has an opening through which the ion beam that is located behind the aperture plate 4 in FIG. 2 can pass. An electrical voltage can be applied between the second fixture part 8 and the electrode plate 12.

A holder 13 that has guide rails 14 that extend parallel to each other on both sides of the longitudinal center axis of the circular opening of the second fixture part 8 is provided on the second fixture part 8. The aperture plate 4 is embodied as a carriage part that can be inserted on the guide rails 14 and can be positioned in such a way relative to a stop 15 that the aperture plate 4 covers the circular opening in the second fixture part 8. In order to separate the aperture plate 4 from the second fixture part 8, the aperture plate 4 can be removed from the guide rails 14.

The positioning device 5 also has a position-changing device, which is not shown in the drawing, by means of which the drive connection between the positioning drives 10a, 10b, 10c and the second fixture part 8 can be temporarily interrupted in a predetermined reference position of the positioning drives 10a, 10b, 10c in order to set the zero position of the positioning device 5.

Figure 3:
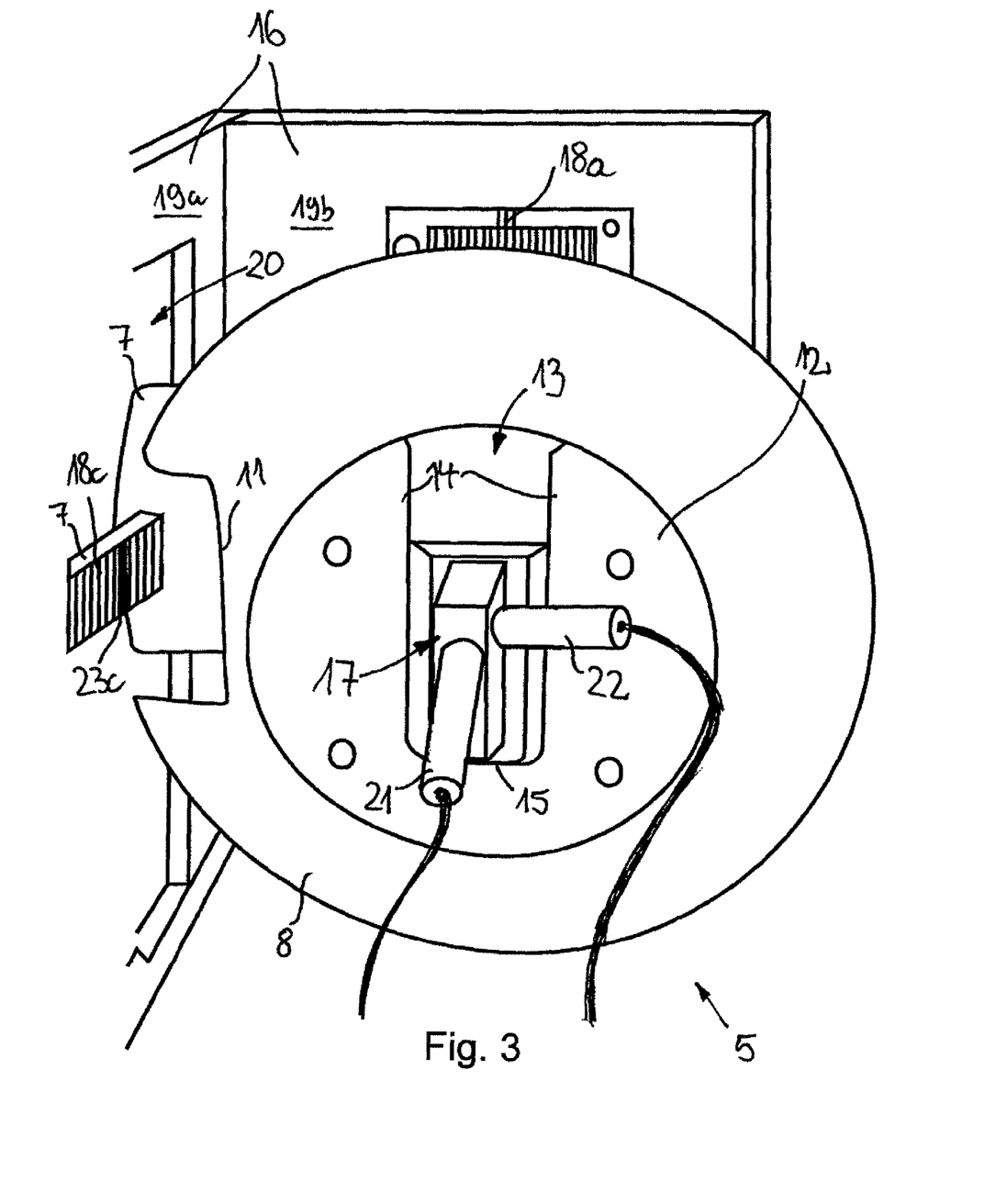
Figure 4:
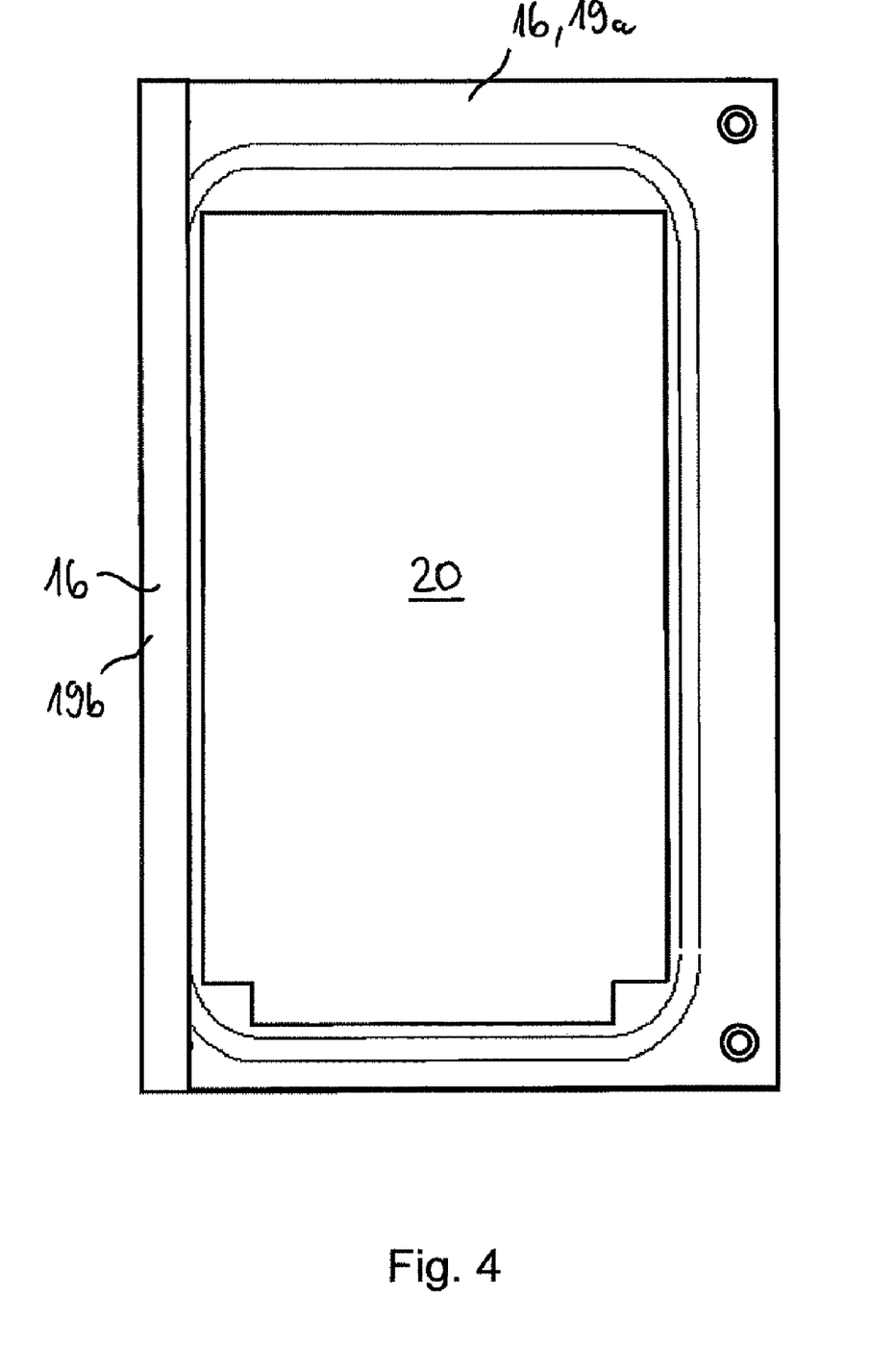
Figure 5:
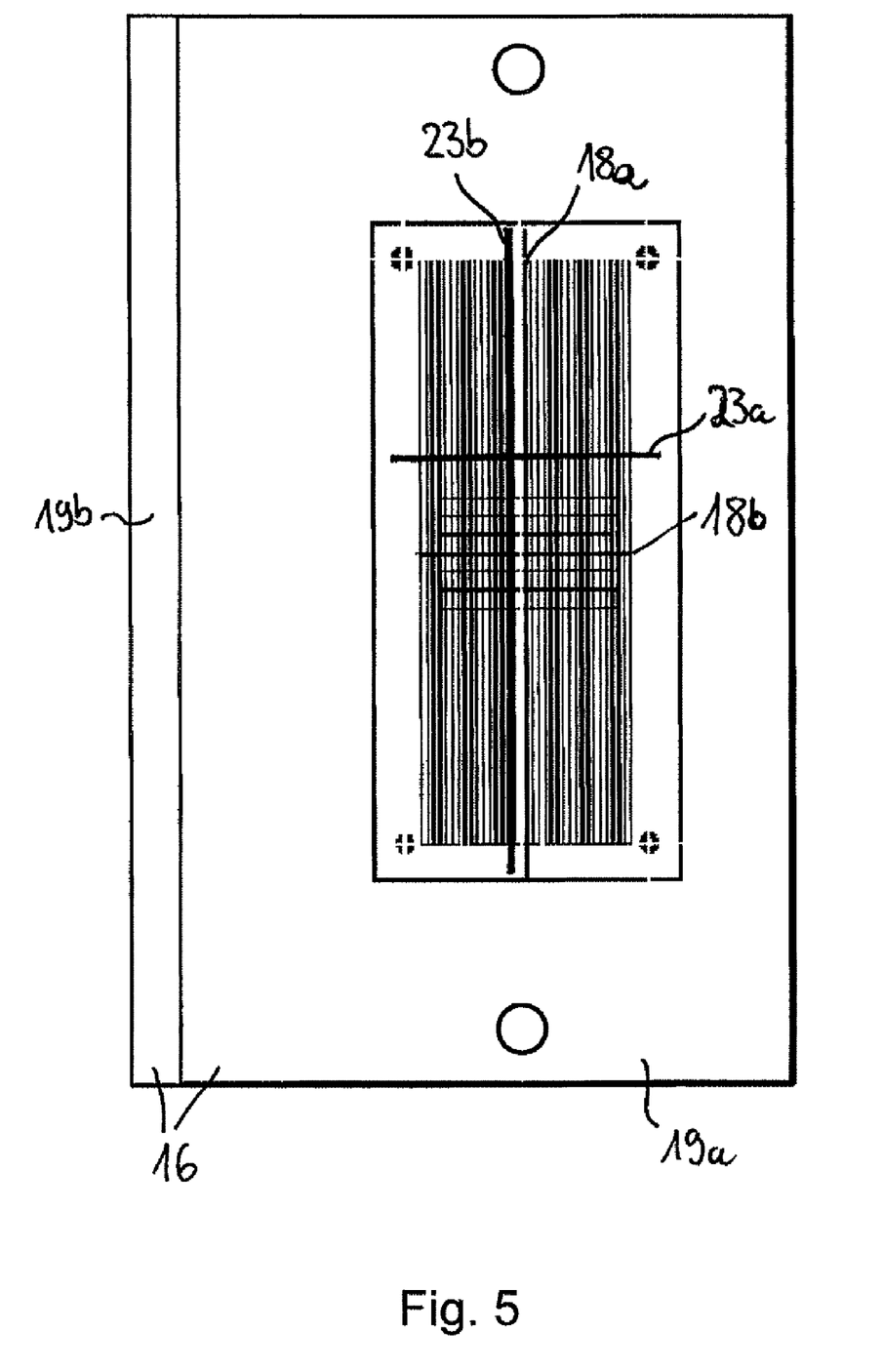

In order to check the zero position of the fixture parts 7, 8, the positioning device 5 has a display device, which has a carrier part 16 and a projection device 17. The carrier part 16 can be connected to the first fixture part 7 in a removable manner and in a defined position relative to said first fixture part 7. Scales that contain reference marks 18a, 18b, 18c are located on the carrier part 16. The reference marks 18a are assigned to the X-axis, the reference marks 18b are assigned to the Y-axis, and the reference marks 18c are assigned to the Z-axis of the positioning device 17. In FIGS. 4 and 5 it can be seen that the carrier part 16 has two plate parts 19a, 19b, of which one is embodied in the shape of a frame with an aperture 20. The aperture 20 is dimensioned in such a way that the carrier part 16 having the aperture 20 can be inserted onto the second fixture part 8 if this fixture part 8 is connected to the first fixture part 7.

As can be seen in FIG. 3, the projection device 17 is embodied as a carriage part that fits together with the guide rails 14 and that can be inserted in the holder 13 instead of the aperture plate 4. The projection device 17 has a grid line projector 21 and a single-line projector 22 whose main projection directions are disposed orthogonally relative to reach other and which are separated from the reference marks 18a, 18b, 18c. Using the grid line projector 21, a first optical line 23a that extends perpendicular to the X-axis and a second optical line 23b that crosses said first line at an angle of approximately 90° are projected onto the reference marks 18a, 18b. Using the single-line projector 22 a third optical line 23c that extends perpendicular to the Z-axis can be projected onto the reference marks 18c.

To control the positioning drives 10a, 10b, 10c when the positioning device 5 is removed from the abutment point 9, a portable control device 24 (FIG. 6) that can be connected in a removable manner to the positioning drives 10a, 10b, 10c by means of an electrical plug-type connection 25 is provided. For each positioning drive 10a, 10b, 10c the control device 24 has an operating element 26a, 26b, 26c by which means the respective positioning drive 10a, 10b, 10c can be moved in the forward and reverse direction.

Figure 6:
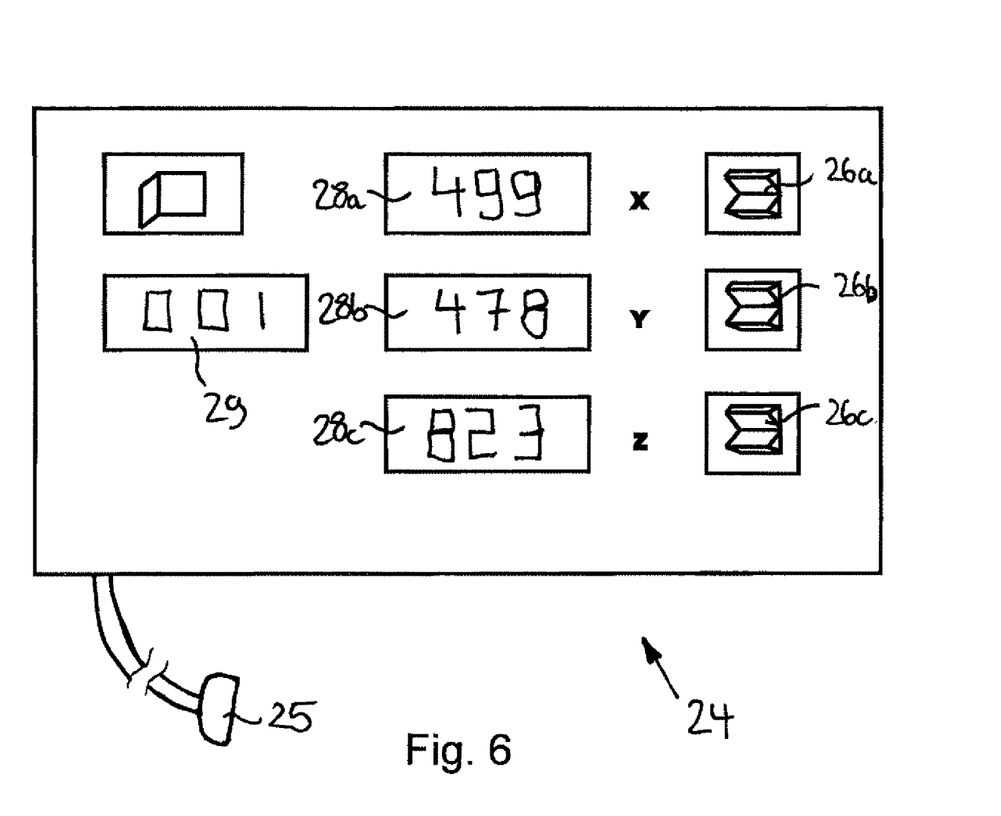
Figure 7:
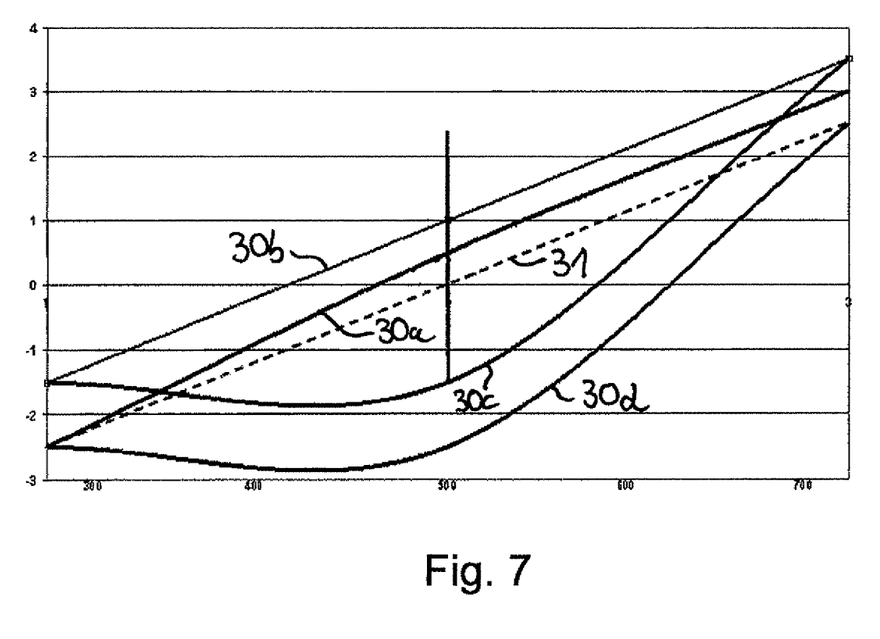
Figure 8:
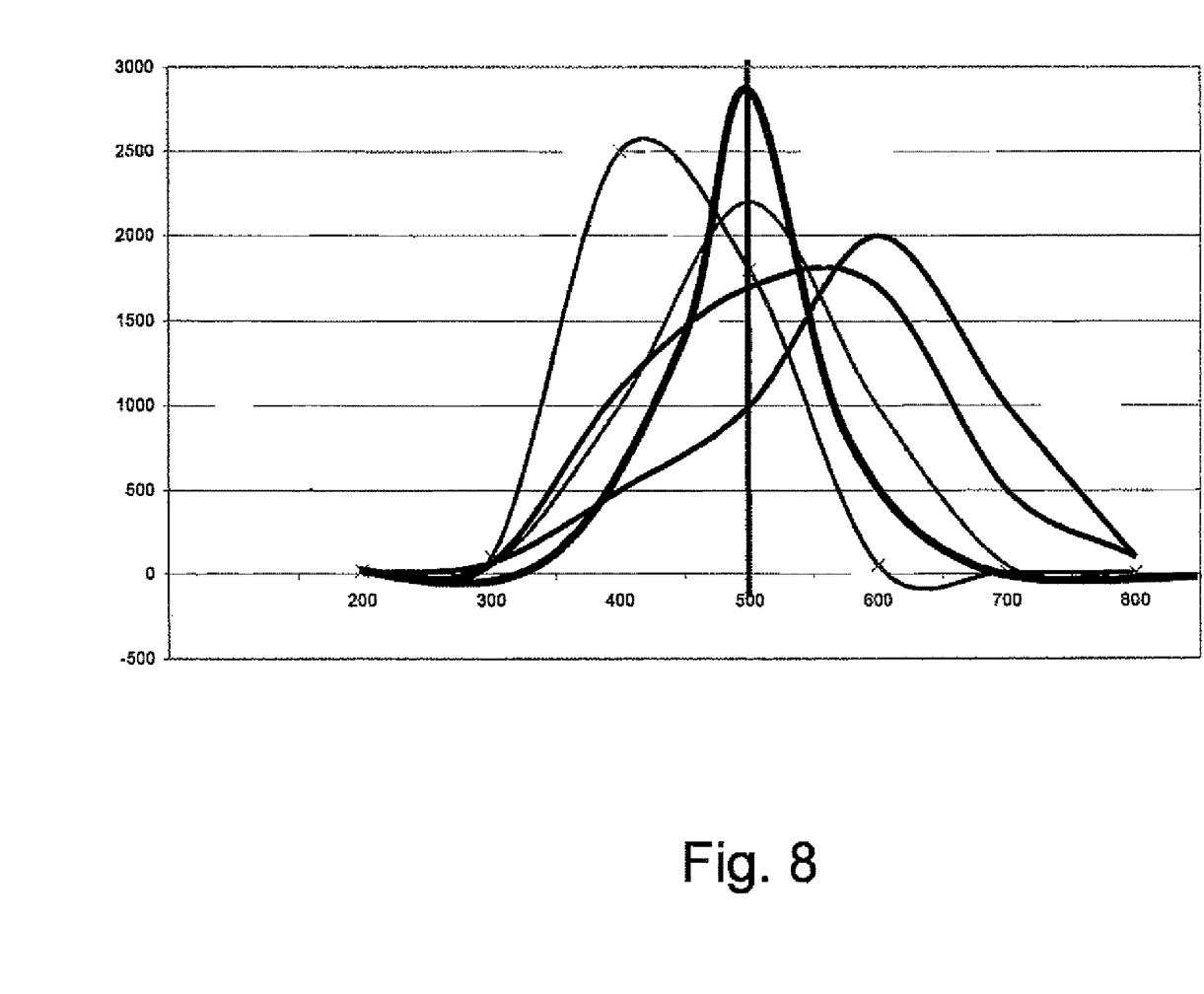
FIG. 8 a graphical representation of the ion currents of the ion implantation systems, where the normalized position measurement signal is plotted on the abscissa and the ion current is plotted in μA on the ordinate, FIG. 9 an electrical substitute circuit diagram showing the positioning device, a compensation device, and a control computer of the ion implantation system, and FIG. 10 a compensation device configured as an adapter for compensating the tolerances of the beam guidance system.

In order to acquire the position of the individual positioning drives 10a, 10b, 10c, a position sensor 27a, 27b, 27c is assigned to each positioning drive 10a, 10b, 10c respectively, and in the example of the embodiment shown in FIG. 8 it has a potentiometer that is drive-connected to the positioning drive 10a, 10b, 10c. Each position sensor 27a, 27b, 27c is electrically connected via the plug-type connection 25 to a position display 28a, 28b, 28c that is assigned to it and that is disposed on the portable control device 24 and is preferably embodied as a digital display. The control device 24 also has a display 29 for the current consumed by the positioning drives 10a, 10b, 10c. With the aid of this display 29, stiffness in the mechanical system that results in increased current consumption by the positioning drives 10a, 10b, 10c can be detected.

In order to adjust the axes, the display device is installed on the positioning device 5 when it is removed from the ion implantation system 1 by connecting the carrier part 16 to the first fixture part 7 and replacing the aperture plate 4 with the projection device 17. The control device 24 is then connected to the positioning device 5 in order to position the axes in such a way that a reference value that is assigned to the respective axis is displayed on the position displays 28a, 28b, 25c.

Then the drive connection between the positioning drives 10a, 10b, 10c and the second fixture part 8 is interrupted in order to position the fixture parts 7, 8 relative to each other in such a way that the optical lines 23a, 23b, 23c each are located in a position that is indicated by the reference marks 18a, 18b, 18c. Then the drive connection between the positioning drives 10a, 10b, 10c and the second fixture part 8 is restored.

A semiconductor fabrication facility that is not shown in the drawing has a number of ion implantation systems 1 that have essentially the same design. On the basis of the characteristic curves 30a, 30b, 30c, 30d in FIG. 9 it can be seen that the ion implantation systems 1 have tolerances. If these tolerances are not compensated, the ion beams 3 travel along path curves that deviate from a specified line 31 with identical positioning of the aperture plate 4. This results in different position measurement signals in the individual implantation systems 1 even though the aperture plate positioning is identical.

in FIG. 8 one can see that, because of the different path curves of the ion beams 3, different ion currents are obtained at the individual wafers that are irradiated in the individual ion implantation systems 1 and that these ion currents are less when the positioning of the aperture plate 4 is centered than the ion current that would be obtained if the ion beam 3 would travel along the specified path 31. As a result of this reduction of the ion currents, a longer time is taken to expose the wafers, so that the productivity of the semiconductor fabrication facility is diminished accordingly.

Figure 9:
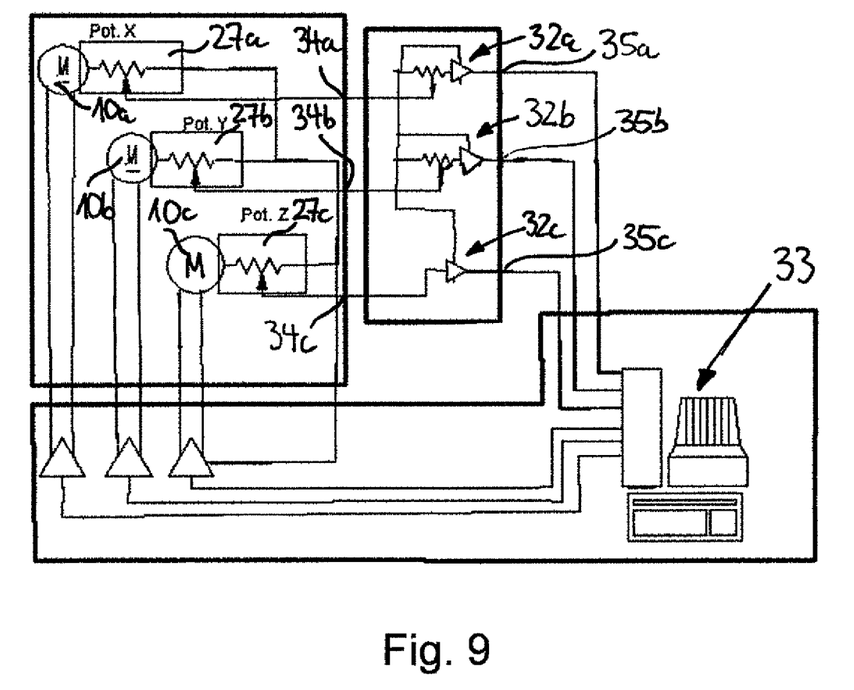

To avoid this, a compensation device 32a, 32b, 32c is assigned to each of the three position sensors 27a, 27b, 27c in the individual ion implantation systems 1, and by means of this device the respective position sensor 27a, 27b, 27c is connected to a position controller that is integrated into a microcomputer 33. In FIG. 9 it can be seen that each position sensor 27a, 27b, 27c has an output connection 34a, 34b, 34c for a first position measurement signal that is connected to an input of the compensation device 32a, 32b, 32c that is assigned to it. Each compensation device 32a, 32b, 32c has an output 35a, 35b, 35c for a second position measurement signal that is connected to an actual-value input of the position controller that is assigned to the respective position compensation device 32a, 32b, 32c.

With the aid of the compensation devices 32a, 32b, 32c, the tolerances of the ion implantation systems 1 are compensated in such a way that their characteristic curve approximately corresponds to the specified line 31. In this way it is possible to interchange the positioning devices 5 of the individual ion implantation systems 1 without the path curves of their ion beams being changed as a result.

Figure 10:
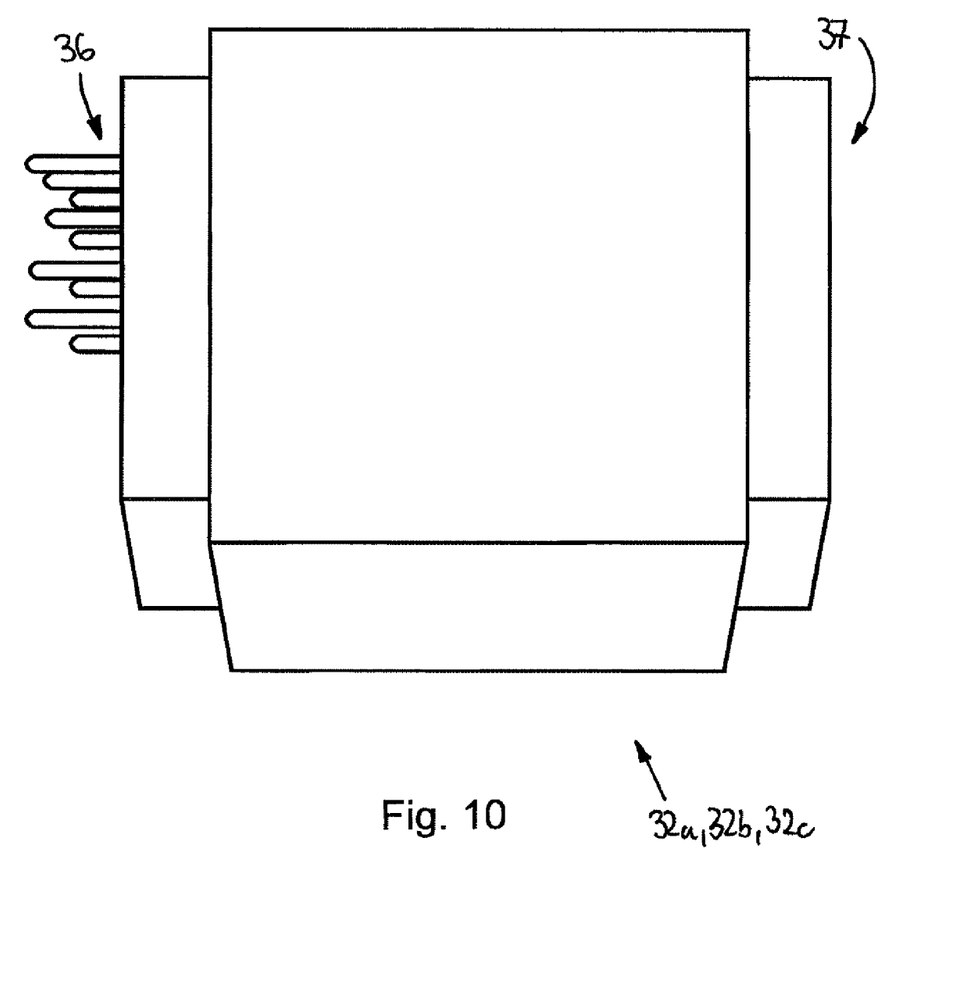

The position sensors 27a, 27b, 27c of the individual ion implantation systems 1 are each connected by means of a plug-type connection to the corresponding position controller. The plug-type connection has a first plug-type connection part located on the microcomputer 33 and a corresponding second plug-type connection part on the positioning device 5. The compensation devices 32a, 32b, 32c of the individual ion implantation systems are configured as an adapter that can be interposed between the plug-type connection parts. As can be seen in FIG. 10, for this purpose the adapter has a third plug-type coupling part 36 that can be connected to the first plug-type connection part, as well as a fourth plug-type connection part 37 that can be connected to the second plug-type connection part.

What is claimed is:

1. A positioning device for positioning an aperture plate in an ion beam of an ion implantation system, where the positioning device has two movable fixture parts that can move relative to each other by means of at least one position drive, a first fixture part being connected to an abutment point disposed in a fixed position relative to an ion beam source, and a second fixture part being connected to the aperture plate, wherein an adjustment device having a fixture device and a display device is provided, said fixture device being operable so that the position of at least one of the fixture parts can be changed relative to the positioning drive, and the display device has at least one reference mark on the first fixture part or a part that is connected to it in a fixed position, wherein the display device on the second fixture part has at least one optical projection device by which means at least one optical marking that is assigned to at least one reference mark is projected onto the first fixture part.

2. The positioning device of claim 1, wherein the aperture plate is connected in a removable manner to a holder that is provided on the second fixture part, and the projection device is embodied in such a way that it can be alternatively connected to one of the holder and the aperture plate.

3. The positioning device of claim 1, wherein the holder has at least one guide rail, preferably for a swallowtail guide, and the aperture plate and the projection device are disposed on a carriage part that fits together with the guide rail can be inserted onto and removed from the guide rail or are embodied as such a carriage part.

4. The positioning device of claim 1, wherein the projection device is embodied so as to project at least two solid and/or dashed lines that are disposed perpendicular to each other, and preferably cross each other, a first line extends approximately parallel to a first axis of the positioning device, and a second line extends approximately parallel to a second axis of the positioning device, and preferably at least one first reference mark is assigned to the first fixture part, and preferably at least one second reference mark is assigned to the second line.

5. The positioning device of claim 4, wherein said positioning device has at least one third axis that extends perpendicular to and, in particular, orthogonally to the first axis and to the second axis, and the projection device is embodied so as to project a third line that extends parallel to the third axis, and preferably at least one third reference mark is assigned to the third line on the first fixture part.

6. The positioning device of claim 1, wherein the holder is connected in a removable manner to the second fixture part and preferably is disposed on an electrode plate that is electrically insulated from the second fixture part and that has a hole for the ion beam to pass through.

7. The positioning device of claim 6, wherein the reference mark, of which at least one is present, is disposed on a carrier part that is removably connected to said first fixture part, and the carrier part is removably connected to the first fixture part so that it can be separated from said first fixture part while the electrode plate is located on the first fixture part.

8. The positioning device of claim 1, wherein a portable control device that can be connected in a removable manner by means of an electrical plug-type connection to at least one positioning drive is provided to control at least one control drive, and the control device has at least one operating element for the positioning drive.

9. The positioning device of claim 1, wherein, in order to acquire the position of a positioning drive, of which at least one must be present, said positioning device has at least one position sensor, and the control device has at least one position display connected to it.

10. An ion implantation system having a positioning device of claim 1, wherein, in order to acquire the position of at least one positioning drive, the positioning device has at least one position sensor with an output connection for a first position measurement signal that is connected by means of a compensation device and the position controller to at least one positioning drive, the compensation device has an input that is provided for the first position measurement signal and that is connected to the position sensor and has an output that is provided for a second position measurement signal and that is connected to a first actual-value input from the position controller, and the compensation device is embodied in such a way that it provides the second position measurement signal depending on the first position measurement signal and at least one machine-specific parameter of the ion implantation system that affects the path curve of the ion beam.

11. The ion implantation system of claim 10, wherein the position sensor, of which at least one must be present, is connected to the position controller by means of a plug-type connection, the plug-type connection has a first plug-type connection part in the corresponding second plug-type connection part, and the compensation device is embodied as an adapter that can be interposed between the plug-type connection parts that has a third plug-type connection part that can be connected to the first plug-type connection part and a fourth plug-type connection part that can be connected to the second plug-type connection part.

12. The ion implantation system of claim 10, wherein the compensation device has at least one positioning element by which means the transfer function between the first and the second position measurement signal can be adjusted.

\* \* \* \* \*